United States Patent
Chang

(10) Patent No.: US 12,487,150 B2
(45) Date of Patent: Dec. 2, 2025

(54) MODULAR REFLUX SAMPLER

(71) Applicant: Kinetics Technology Corporation, New Taipei (TW)

(72) Inventor: Chung-Hsiang Chang, New Taipei (TW)

(73) Assignee: Kinetics Technology Corporation, New Taipei (TW)

( * ) Notice: Subject to any disclaimer, the term of this patent is extended or adjusted under 35 U.S.C. 154(b) by 315 days.

(21) Appl. No.: 18/346,813

(22) Filed: Jul. 4, 2023

(65) Prior Publication Data
US 2025/0012679 A1    Jan. 9, 2025

(51) Int. Cl.
*G01N 1/22*     (2006.01)
*F25B 9/04*     (2006.01)

(52) U.S. Cl.
CPC .............. *G01N 1/2202* (2013.01); *F25B 9/04* (2013.01); *G01N 2001/2282* (2013.01)

(58) Field of Classification Search
CPC .. G01N 1/2202; G01N 2001/2282; F25B 9/04
See application file for complete search history.

(56) References Cited

FOREIGN PATENT DOCUMENTS

| CN | 1869633 A | * | 11/2006 | |
|---|---|---|---|---|
| RU | 2692374 C1 | * | 6/2019 | ......... G01N 33/0016 |
| WO | WO-2008073276 A1 | * | 6/2008 | ........... B29C 33/046 |

OTHER PUBLICATIONS

English translation of CN1869633, accessed from worldwide.espacenet.com.*
English translation of RU2692374, accessed from worldwide.espacenet.com.*

* cited by examiner

*Primary Examiner* — Kristina M Deherrera
*Assistant Examiner* — Jean F Morello

(57) ABSTRACT

The present invention relates to a modular reflux sampler, including a condenser container and a vortex tube. The condenser container is enclosed outside a gas pipeline to be cooled; the vortex tube has a cold air nozzle; the cold air nozzle extends into the condenser container to inject cold air in order to cool the gas pipeline; the vortex tube is connected with a compressed air duct to input compressed air as a cold air raw material; wherein the compressed air duct has a section to pass through the condenser container; and the vortex tube cools the compressed air duct while cooling the gas pipeline, so that the temperature of the compressed air flowing into the vortex tube is reduced, the temperature of the cold air ejected by the cold air nozzle is reduced, the cold air with a lower temperature is input to the condenser container to repeat cooling operation, and a better cooling effect is achieved.

6 Claims, 3 Drawing Sheets

MODULAR REFLUX SAMPLER

BACKGROUND OF THE INVENTION

1. Field of the Invention

The present invention relates to the field of a gas cooling device, and in particular, to a device for energy-saving and improving gas cooling effect.

2. Description of the Prior Art

It is usually necessary to cool collected gas in the process of inspecting and sampling or discharging and recovering gas. On one hand, water and impurities in the gas is condensed to ensure the gas quality and improve the accuracy of inspect and analysis; and on the other hand, pollution discharge is reduced to improve the safety of discharged gas.

Therefore, a cooler is provided in a conventional gas pipeline to cool the gas. Usually, in a case that a vortex tube device is used for cooling the gas, a cold air nozzle of the vertex tube releases cold air toward the gas pipeline, that is, gas in the gas pipeline can be cooled.

However, a conventional cooler has the disadvantage of insufficient cooling effect in use, resulting in limited quality of the collected gas, so various subsequent works are affected and are necessary to improve.

A reason for the insufficient effect of the vortex cooler is mainly that the cold air raw material of the vortex tube is from compressed air and is connected into the vortex tube by an air compressor or air pressure regulator through a gas supply pipeline. The gas supply pipeline is erected in a normal-temperature environment, so that in addition to its own temperature, the compressed air will also absorb the heat of the environment during the transportation, and the temperature of the compressed air entering the vortex tube is increased to a certain temperature, thereby naturally reducing the cooling effect of the vortex tube.

Or some people consider an improved solution to increase the number of the vortex tubes, so that more cold air is blown to a gas to be cooled; however, more cold air only can accelerate the cooling speed and cannot reduce the cooling temperature, so the problem of insufficient cooling effect still cannot be solved.

Therefore, a more reasonable solution to reduce the cooling temperature shall consider how to reduce the temperature of the compressed air. However, in a case that other cooling units are added to cool the compressed air, it is necessary to consume more energy, and in view of the achieved purpose, it is more efficient to directly apply the cooling unit to the gas to be cooled.

SUMMARY OF THE INVENTION

A main object of the present invention is to provide a modular reflux sampler, which has a good cooling effect, and can effectively condense water and impurities in the gas, improve the gas quality and reduce pollution discharge.

Another object of the present invention is to provide a modular reflux sampler, which can reduce energy consumption and meet the requirements of energy conservation and environmental protection while maintaining the gas cooling effect.

Another objective of the present invention is to provide a modular reflex sampler, which has a simple structure, easy erection, stable quality, is not easy to be damaged, and can work continuously for a long time and reduce the use cost.

A modular reflux sampler, capable of achieving the foregoing objectives, of the present invention includes:
a condenser container, enclosed outside a gas pipeline to be cooled;
a vortex tube, having a cold air nozzle, the cold air nozzle extended into the condenser container to inject cold air to cool the gas pipeline, the vortex tube connected with a compressed air duct to input compressed air as a cold air raw material, wherein the compressed air duct has a section to pass through the condenser container; and the vortex tube cools the compressed air duct while cooling the gas pipeline, so that the temperature of the compressed air flowing into the vortex tube is reduced, the temperature of the cold air ejected by the cold air nozzle is reduced, the cold air with a lower temperature is input to the condenser container to repeat cooling operation, and a better cooling effect is achieved.

Further, the condenser container is a long cylinder shape and arranged vertically, so that the cold air nozzle extends into an upper end of the condenser container; and a discharge port is formed at a lower end of the condenser container, so that residues generated after cooling flows out of the discharging port.

Further, the compressed air duct is spirally wound and formed at the section of the condenser container to increase the contact surface area of the compressed air duct and the cold air.

Further, wherein, more than one vortex tube, compressed air duct and cold air inlet are provided to perform cooling operation on the condenser container in multiple directions at the same time.

Further, a gas inlet end of the gas pipeline of the condenser container is connected with a filter container, and a filter layer is provided in the filter container to pre-filter gas entering the gas pipeline of the condenser container.

An extending pipeline connected to a lower end of the condenser container is provided at an upper end of the filter container; and the low-temperature and fluid-state residue generated by the condenser container flows through the filter layer to take away impurities generated by filtering and autonomously fall back into an original exhaust flow path.

DETAILED DESCRIPTION OF THE PREFERRED EMBODIMENTS

Figure 1:
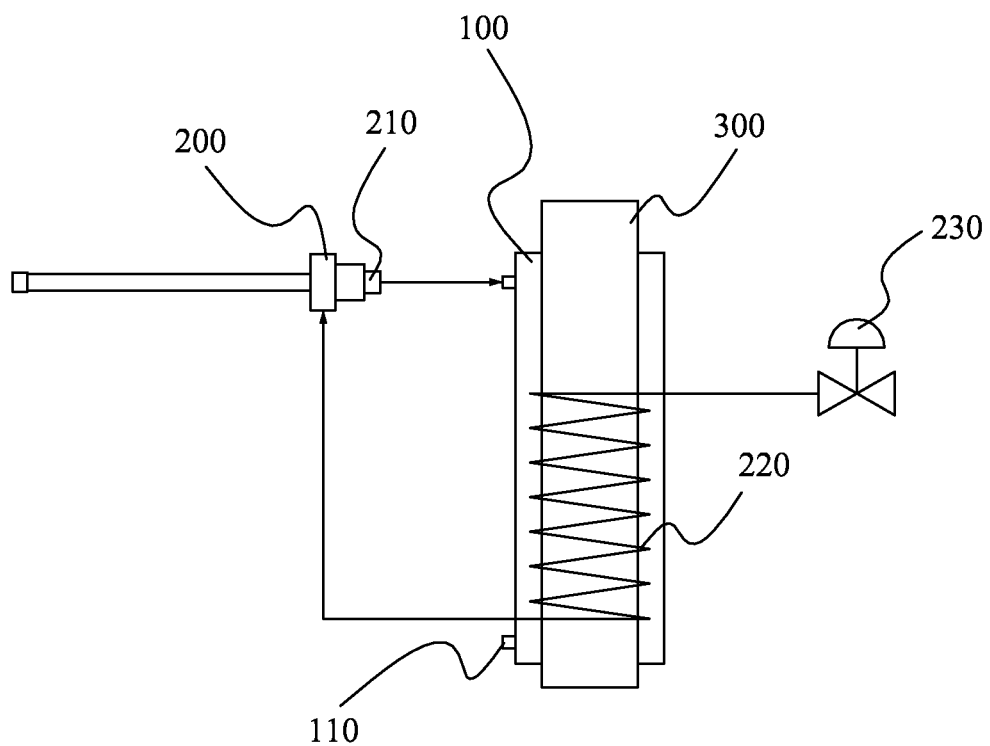
FIG. 1 is a schematic structural diagram of the present invention.
Figure 2:
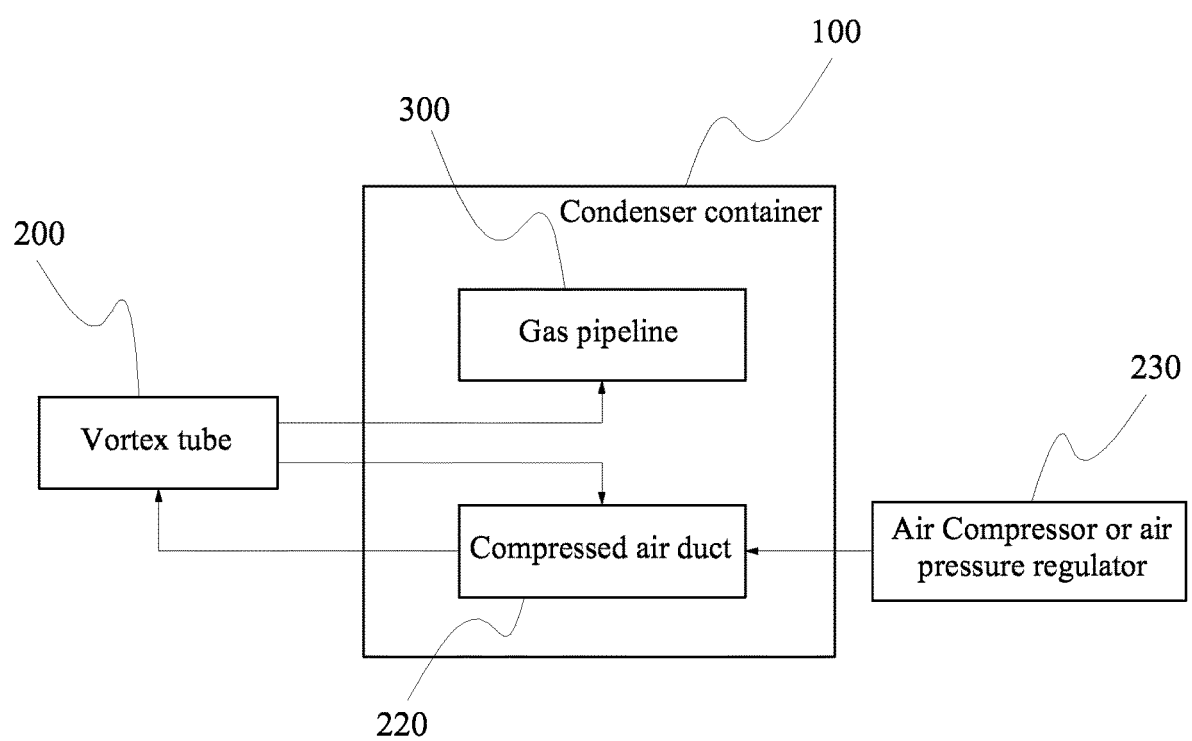
FIG. 2 is a block diagram of a working principle of the present invention.

Referring to FIG. 1 and FIG. 2, the present invention provides a modular reflux sampler, mainly including a condenser container 100 and a vortex tube 200.

The condenser container 100 is enclosed outside a gas pipeline 300 to be cooled; the vortex tube 200 has a cold air nozzle 210; the cold air nozzle 210 extends into the condenser container 100 to inject cold air in order to cool the gas pipeline 300; the vortex tube 200 is connected with a compressed air duct 220 to input compressed air from an air compressor or a compressed air regulator 230 as a cold air raw material; the compressed air duct 220 has a section to pass through the condenser container 100; and the vortex tube 200 cools the compressed air duct 220 while cooling the gas pipeline 300, so that the temperature of the compressed air flowing into the vortex tube 200 is reduced, and the temperature of the cold air ejected by the cold air nozzle 210 is reduced.

The working principle of the device composed of the foregoing units is as follows: firstly, the gas pipeline 300 is cooled by the generated cold air, and the cold air passes through the section position of the compressed air duct 220 of the condenser container 100 to pre-cool the compressed air; and then the compressed air with low temperature is guided to the vortex tube 200 to generate cold air with a lower temperature, and can be input to the condenser container 100 for cooling at a lower temperature. Therefore, the foregoing actions are repeated to greatly reduce the output temperature of the cold air and improve the cooling effect of the gas pipeline 300. Furthermore, the cooling operation does not need to consume additional energy, thereby ensuring the demand of energy conservation and environmental protection.

In the foregoing design, the condenser container 100 is a long cylinder shape and arranged vertically, so that the cold air nozzle 210 extends into the upper end of the condenser container 100, and a discharge port 110 is formed at the lower end of the condenser container 100. Therefore, the cold air can naturally fall to comprehensively cool the gas pipeline 300, and the residues generated by condensation after cooling are discharged through the discharge port 110.

Furthermore, the compressed air duct 220 is spirally wound and formed at the section of the condenser container 100, and spiral winding can increase the contact area of the compressed air duct 220 and the condenser container 100, thereby improving the cooling effect of the compressed air.

In addition, more than one vortex tube 200, compressed air duct 220 and cold air inlet are provided (not shown in the figure), and may be provided at different positions of the condenser container 100, thereby cooling the condenser container 100 in multiple directions at the same time.

Figure 3:
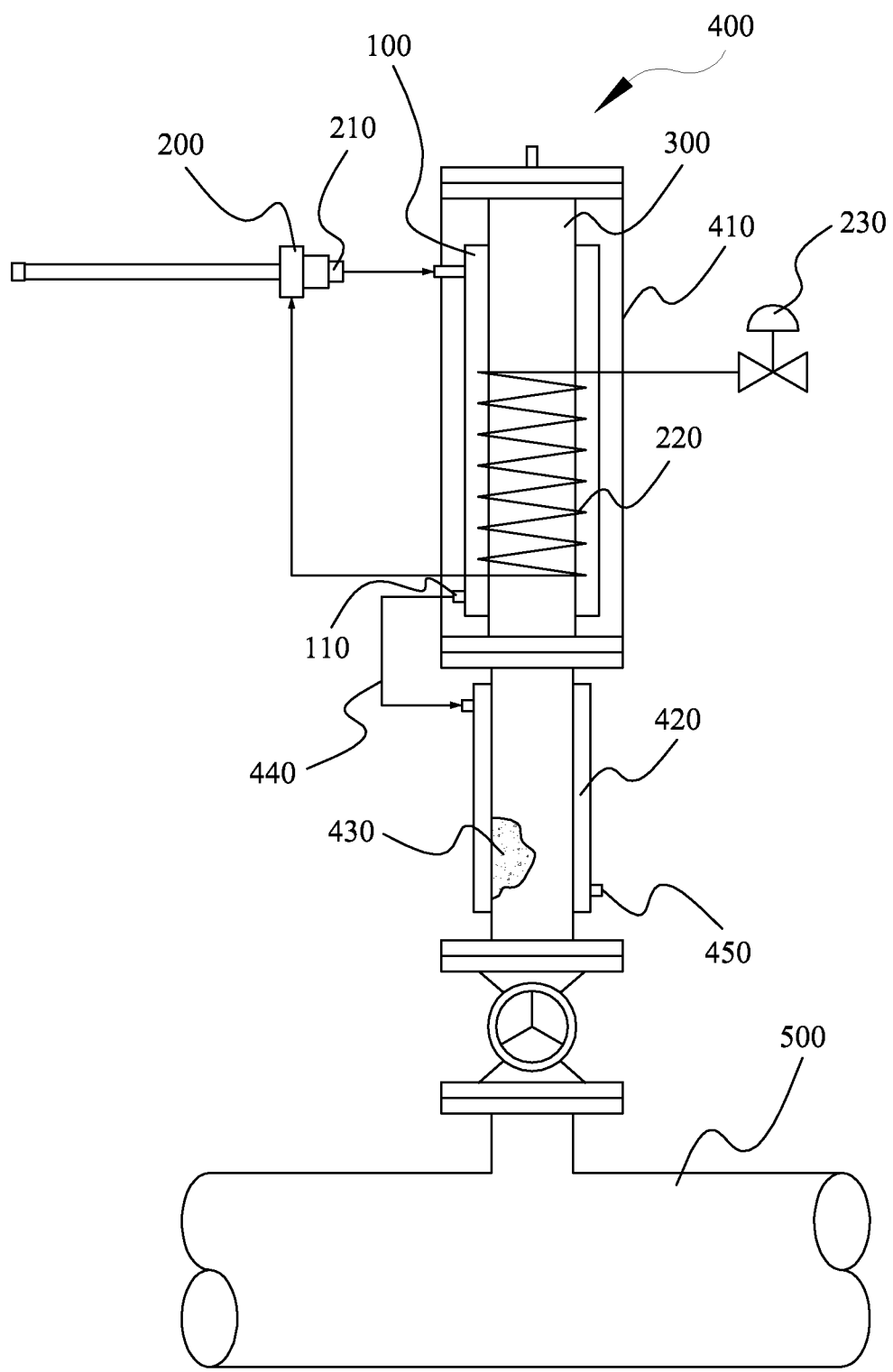
FIG. 3 is an embodiment diagram applied to a reflux sampler of the present invention.

Referring to FIG. 3, the present invention may be applied to gas sampling operation in practice. For example, a reflux sampler 400 provided by this embodiment is erected on an exhaust flow path 500 of an industrial process in a vertical direction, and the foregoing gas pipeline 300 of the present invention is arranged in the reflux sampler 400, so that the gas pipeline 300 is connected to the exhaust flow path for gas sampling.

The reflux sampler 400 includes two main parts, that is, an upper condenser section and a lower filter section, wherein the upper condenser section has a metal (such as stainless steel) housing 410 for packaging the condenser container 100 of the present invention; the lower filter section includes a filter container 420; a filter layer 430 is provided in the filter container 420; and the filter layer 430 is a coarse metal (such as stainless steel) mesh, so that before a high-temperature process gas introduced by the exhaust flow path 500 enters the condenser container 100, heavy oils and tars or dust are pre-condensed through the filter container 420, and then the particulate impurities are filtered and adhered to the filter layer 430 and autonomously fall back into the exhaust flow path 500 by gravity.

Further, an extending pipeline 440 connected to the condenser container 100 is provided at an upper end of the filter container 420, and the residue generated by the condenser container 100 flows through the filter layer 430. The residue generated by the condenser container 100 still can maintain a certain low temperature, thereby helping to lower the temperature of the high-temperature process gas. Furthermore, the residue is mainly a condensed water mixture and has a fluid state in order to flush to take away the impurities generated by filtering and autonomously fall back into the exhaust flow path 500 by gravity. A blowback port 450 is formed at a lower end of the filter container to connect steam or compressed air to backwash a mixture such as particulate impurities or heavy tars and tars adhered to the filter layer 430.

Of course, the present invention is not limited to gas sampling work. All the works related to gas cooling, such as various waste gas recovery processing operations, belongs to the protection scope of the present invention.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

REFERENCE NUMERAL DESCRIPTION

100: Condenser container
110: Discharge port
200: Vortex tube
210: Cold air nozzle
220: Compressed air duct
230: Air compressor or compressed air regulator
300: Gas pipeline
400: Reflux sampler
410: Housing
420: Filter container
430: Filter layer
440: Extending pipeline
450: Blowback port
500: Exhaust flow path

What is claimed is:

1. A modular reflux sampler, comprising:
a condenser container, enclosed outside a gas pipeline to be cooled;
a vortex tube, having a cold air nozzle, the cold air nozzle extended into the condenser container to inject cold air to cool the gas pipeline; the vortex tube connected with a compressed air duct to input compressed air as a cold air raw material, wherein the compressed air duct has a section to pass through the condenser container; and the vortex tube cools the compressed air duct while cooling the gas pipeline, so that the temperature of the compressed air flowing into the vortex tube is reduced, the temperature of the cold air ejected by the cold air nozzle is reduced, the cold air with a lower temperature is input to the condenser container to repeat cooling operation.

2. The modular reflux sampler according to claim 1, wherein the condenser container is a long cylinder shape and arranged vertically, so that the cold air nozzle extends into an upper end of the condenser container; and a discharge port is formed at a lower end of the condenser container, so that residues generated after cooling flows out of the discharging port.

3. The modular reflux sampler according to claim 1, wherein the compressed air duct is spirally wound and formed at the section of the condenser container.

4. The modular reflux sampler according to claim 1, wherein more than one vortex tube, compressed air duct and cold air inlet are provided to perform cooling operation on the condenser container in multiple directions at the same time.

5. The modular reflux sampler according to claim 1, wherein a gas inlet end of the gas pipeline of the condenser container is connected with a filter container, and a filter layer is arranged in the filter container to pre-filter gas entering the gas pipeline of the condenser container.

6. The modular reflux sampler according to claim 5, wherein an extending pipeline connected to a lower end of the condenser container is arranged at an upper end of the filter container; the low-temperature and fluid-state residue generated by the condenser container flows through the filter layer to take away impurities generated by filtering; and a blowback port is formed at a lower end of the filter container to connect steam or compressed air to back-wash a mixture such as particulate impurities or heavy oils and tars adhered to the filter layer.

* * * * *